(12) United States Patent
Xie et al.

(10) Patent No.: US 7,554,317 B2
(45) Date of Patent: Jun. 30, 2009

(54) CRITICAL CURRENT TESTING TECHNIQUES FOR SUPERCONDUCTING CONDUCTORS

(75) Inventors: Yi-Yuan Xie, Guilderland, NY (US); Hee-Gyoun Lee, Ansan (KR); Venkat Selvamanickam, Wynantskill, NY (US)

(73) Assignee: SuperPower, Inc., Schenectady, NY (US)

( * ) Notice: Subject to any disclaimer, the term of this patent is extended or adjusted under 35 U.S.C. 154(b) by 68 days.

(21) Appl. No.: 10/950,189

(22) Filed: Sep. 24, 2004

(65) Prior Publication Data

US 2006/0073977 A1    Apr. 6, 2006

(51) Int. Cl.
*G01N 27/00* (2006.01)
*G01R 19/00* (2006.01)
(52) U.S. Cl. .................................. 324/71.6; 324/76.11
(58) Field of Classification Search ................. 324/71.6, 324/76.11; 505/843
See application file for complete search history.

(56) References Cited

U.S. PATENT DOCUMENTS

| | | | | | |
|---|---|---|---|---|---|
| 4,118,984 | A | * | 10/1978 | Kuraoka et al. | 73/295 |
| 5,507,924 | A | * | 4/1996 | Mikumo et al. | 205/641 |
| 5,936,394 | A | * | 8/1999 | Kaneko et al. | 324/72 |
| 6,235,685 | B1 | * | 5/2001 | Maeda et al. | 505/470 |
| 6,452,375 | B1 | | 9/2002 | Coulter et al. | |
| 2005/0014653 | A1 | * | 1/2005 | Reeves et al. | 505/100 |

* cited by examiner

*Primary Examiner*—Amy He
(74) *Attorney, Agent, or Firm*—Larson Newman Abel & Polansky, LLP

(57) ABSTRACT

A method for testing a superconducting coated conductor is disclosed. The method includes providing a superconducting coated conductor having an dimension ratio of not less than about $10^2$; and measuring a voltage over a plurality of segments of the superconducting article while applying a constant current $I_{cc}$.

29 Claims, 5 Drawing Sheets

CRITICAL CURRENT TESTING TECHNIQUES FOR SUPERCONDUCTING CONDUCTORS

CROSS-REFERENCE TO RELATED APPLICATION(S)

BACKGROUND

1. Field of the Invention

The present invention is generally directed to superconductor articles and methods for forming same. The invention is particularly related to superconductor articles in the form of coated conductors, and devices incorporating same.

2. Description of the Related Art

Superconductor materials have long been known and understood by the technical community. Low-temperature (low-$T_c$) superconductors exhibiting superconductive properties at temperatures requiring use of liquid helium (4.2 K), have been known since about 1911. However, it was not until somewhat recently that oxide-based high-temperature (high-$T_c$) superconductors have been discovered. Around 1986, a first high-temperature superconductor (HTS), having superconductive properties at a temperature above that of liquid nitrogen (77 K) was discovered, namely $YBa_2Cu_3O_{7-x}$ (YBCO), followed by development of additional materials over the past 15 years including $Bi_2Sr_2Ca_2Cu_3O_{10+y}$ (BSCCO), and others. The development of high-$T_c$ superconductors has created the potential of economically feasible development of superconductor components incorporating such materials, due partly to the cost of operating such superconductors with liquid nitrogen rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the native resistance of copper-based commercial power components is responsible for billions of dollars per year in losses of electricity, and accordingly, the power industry stands to gain based upon utilization of high-temperature superconductors in power components such as transmission and distribution power cables, generators, transformers, and fault current interrupters. In addition, other benefits of high-temperature superconductors in the power industry include a factor of 3-10 increase of power-handling capacity, significant reduction in the size (i.e., footprint) of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the challenges associated with the commercialization of high-temperature superconductors, many exist around the fabrication of a superconducting tape that can be utilized for formation of various power components. A first generation of superconducting tape includes use of the above-mentioned BSCCO high-temperature superconductor. This material is generally provided in the form of discrete filaments, which are embedded in a matrix of noble metal, typically silver. Although such conductors may be made in extended lengths needed for implementation into the power industry (such as on the order of kilometers), due to materials and manufacturing costs, such tapes do not represent a commercially feasible product.

Accordingly, a great deal of interest has been generated in the so-called second-generation HTS tapes that have superior commercial viability. These tapes typically rely on a layered structure, generally including a flexible substrate that provides mechanical support, at least one buffer layer overlying the substrate, the buffer layer optionally containing multiple films, an HTS layer overlying the buffer film, and an electrical stabilizer layer overlying the superconductor layer, typically formed of at least a noble metal. However, to date, numerous engineering and manufacturing challenges remain prior to full commercialization of such second generation-tapes.

Accordingly, in view of the foregoing, various needs continue to exist in the art of superconductors, and in particular, provision of commercially viable superconducting tapes, methods for forming same, and power components utilizing such superconducting tapes.

In addition to the general needs in the art discussed above, it is also more specifically desired to provide techniques for testing and qualifying superconductive tapes, and in particular, techniques for qualifying current carrying capabilities of coated superconductor tapes.

SUMMARY

According to a first aspect, a method for testing a superconducting conductor is provided, wherein a superconducting conductor, and voltage is measured over a plurality of segments of the superconducting conductor while applying a constant current $I_{cc}$.

According to another aspect, a method for testing a superconducting conductor is provided, in which a conductor having a dimension ratio of no less than $10^2$ is provided and continuously translating the coated conductor while measuring a voltage over a plurality of segments of the superconducting conductor.

DETAILED DESCRIPTION

Figure 1:
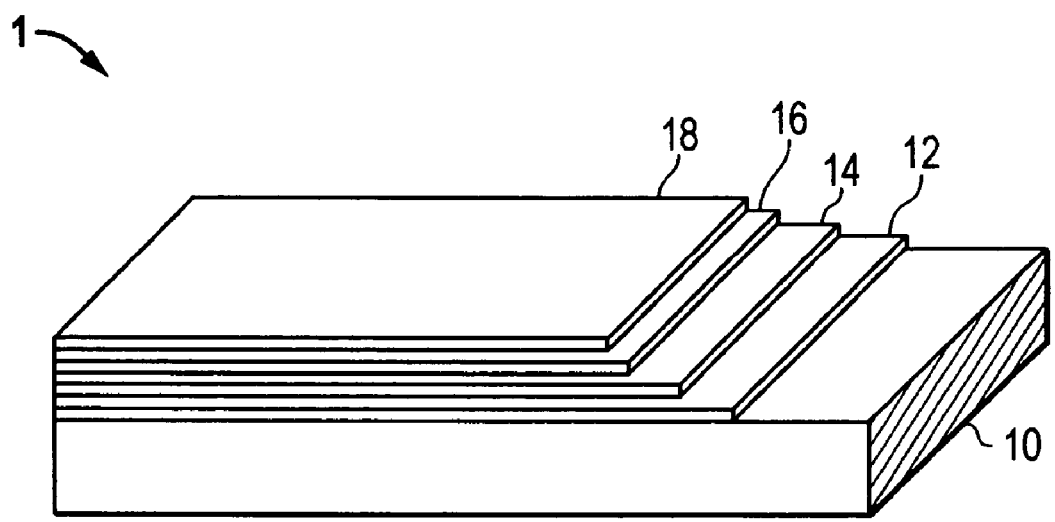
FIG. 1 illustrates a general layered structure of a superconductive tape conductor according to an embodiment of the present invention.

Turning to FIG. 1, the general layered structure of a superconductive article 1 according to an embodiment of the present invention is depicted. The superconductive article 1 includes a substrate 10, a buffer layer 12 overlying the substrate 10, a superconductor layer 14, followed by a capping layer 16 (optional), typically a noble metal layer, and a stabilizer layer 18 (optional), typically a non-noble metal.

The substrate 10 is generally metal-based, and typically, an alloy of at least two metallic elements. Particularly suitable substrate materials include nickel-based metal alloys such as the known Inconel® group of alloys. The Inconel® alloys tend to have desirable creep, chemical and mechanical properties, including coefficient of expansion, tensile strength, yield strength, and elongation. These metals are generally commercially available in the form of spooled tapes, particularly suitable for superconductor tape fabrication, which typically will utilize reel-to-reel tape handling.

The substrate 10 is typically in a tape-like configuration, having a high dimension ratio. For example, the width of the tape is generally on the order of about 0.4-10 cm, and the length of the tape is typically at least about 100 m, most typically greater than about 500 m. Indeed, embodiments of the present invention provide for superconducting tapes that include substrate 10 having a length on the order of 1 km or above. Accordingly, the substrate may have a dimension ratio which is fairly high, on the order of not less than 10, not less than about $10^2$, or even not less than about $10^3$. Certain embodiments are longer, having a dimension ratio of $10^4$ and higher. As used herein, the term 'dimension ratio' is used to denote the ratio of the length of the substrate or tape to the next longest dimension, the width of the substrate or tape.

In one embodiment, the substrate is treated so as to have desirable surface properties for subsequent deposition of the constituent layers of the superconductor tape. For example, the surface may be lightly polished to a desired flatness and surface roughness. Additionally, the substrate may be treated to be biaxially textured as is understood in the art, such as by the known RABiTS (roll assisted biaxially textured substrate) technique.

Turning to the buffer layer 12, the buffer layer may be a single layer, or more commonly, be made up of several films. Most typically, the buffer layer includes a biaxially textured film, having a crystalline texture that is generally aligned along crystal axes both in-plane and out-of-plane of the film. Such biaxial texturing may be accomplished by IBAD. As is understood in the art, IBAD. is, acronym that stands for ion beam assisted deposition, a technique that may be advantageously utilized to form a suitably textured buffer layer for subsequent formation of an superconductor layer having desirable crystallographic orientation for superior superconducting properties. Magnesium oxide is a typical material of choice for the IBAD film, and may be on the order or 50 to 500 Angstroms, such as 50 to 200 Angstroms. Generally, the IBAD film has a rock-salt like crystal structure, as defined and described in U.S. Pat. No. 6,190,752, incorporated herein by reference.

The buffer layer may include additional films, such as a barrier film provided to directly contact and be placed in between an IBAD film and the substrate. In this regard, the barrier film may advantageously be formed of an oxide, such as yttria, and functions to isolate the substrate from the IBAD film. A barrier film may also be formed of non-oxides such as silicon nitride. Suitable techniques for deposition of a barrier film include chemical vapor deposition and physical vapor deposition including sputtering. Typical thicknesses of the barrier film may be within a range of about 100-200 Angstroms. Still further, the buffer layer may also include an epitaxially grown film, formed over the IBAD film. In this context, the epitaxially grown film is effective to increase the thickness of the IBAD film, and may desirably be made principally of the same material utilized for the IBAD layer such as MgO.

In embodiments utilizing an MgO-based IBAD film and/or epitaxial film, a lattice mismatch between the MgO material and the material of the superconductor layer exists. Accordingly, the buffer layer may further include another buffer film, this one in particular implemented to reduce a mismatch in lattice constants between the superconductor layer and the underlying IBAD film and/or epitaxial film. This buffer film may be formed of materials such as YSZ (yttria-stabilized zirconia) strontium ruthenate, lanthanum manganate, and generally, perovskite-structured ceramic materials. The buffer film may be deposited by various physical vapor deposition techniques.

While the foregoing has principally focused on implementation of a biaxially textured film in the buffer stack (layer) by a texturing process such as IBAD, alternatively, the substrate surface itself may be biaxially textured. In this case, the buffer layer is generally epitaxially grown on the textured substrate so as to preserve biaxial texturing in the buffer layer. One process for forming a biaxially textured substrate is the process known in the art as RABiTS (roll assisted biaxially textured substrates), generally understood in the art.

The superconductor layer 14 is generally in the form of a high-temperature superconductor (HTS) layer. HTS materials are typically chosen from any of the high-temperature superconducting materials that exhibit superconducting properties above the temperature of liquid nitrogen, 77K. Such materials may include, for example, $YBa_2Cu_3O_{7-x}$, $Bi_2Sr_2Ca_2Cu_3O_{10+y}$, $Tl_2Ba_2Ca_2Cu_3O_{10+y}$, and $HgBa_2Ca_2Cu_3O_{8+y}$. One class of materials includes $REBa_2Cu_3O_{7-x}$, wherein RE is a rare earth element. Of the foregoing, $YBa_2Cu_3O_{7-x}$, also generally referred to as YBCO, may be advantageously utilized. The superconductor layer 14 may be formed by any one of various techniques, including thick and thin film forming techniques. Preferably, a thin film physical vapor deposition technique such as pulsed laser deposition (PLD) can be used for a high deposition rates, or a chemical vapor deposition technique can be used for lower cost and larger surface area treatment. Typically, the superconductor layer has a thickness on the order of about 1 to about 30 microns, most typically about 2 to about 20 microns, such as about 2 to about 10 microns, in order to get desirable amperage ratings associated with the superconductor layer 14.

The capping layer 16 and the stabilizer layer 18 are generally implemented to provide a low resistance interface and for electrical stabilization to aid in prevention of superconductor burnout in practical use. More particularly, layers 16 and 18 aid in continued flow of electrical charges along the superconductor in cases where cooling fails or the critical current density is exceeded, and the superconductor layer moves from the superconducting state and becomes resistive. Typically, a noble metal is utilized for capping layer 16 to prevent unwanted interaction between the stabilizer layer(s) and the superconductor layer 14. Typical noble metals include gold, silver, platinum, and palladium. Silver is typically used due to its cost and general accessibility. The capping layer 16 is typically made to be thick enough to prevent unwanted diffusion of the components from the stabilizer layer 18 into the superconductor layer 14, but is made to be generally thin for cost reasons (raw material and processing costs). Typical thicknesses of the capping layer 16 range within about 0.1 to about 10.0 microns, such as 0.5 to about 5.0 microns. Various techniques may be used for deposition of the capping layer 16, including physical vapor deposition, such as DC magnetron sputtering.

The stabilizer layer 18 is generally incorporated to overlie the superconductor layer 14, and in particular, overlie and directly contact the capping layer 16 in the particular embodiment shown in FIG. 1. The stabilizer layer 18 functions as a protection/shunt layer to enhance stability against harsh environmental conditions and superconductivity quench. The layer is generally dense and thermally and electrically conductive, and functions to bypass electrical current in case of failure of the superconducting layer. It may be formed by any one of various thick and thin film forming techniques, such as by laminating a pre-formed copper strip onto the superconducting tape, by using an intermediary bonding material such as a solder or flux. Other techniques have focused on physical vapor deposition, typically evaporation or sputtering, as well as wet chemical processing such as electroless plating, and electroplating. In this regard, the capping layer 16 may function as a seed layer for deposition of copper thereon.

Figure 2:
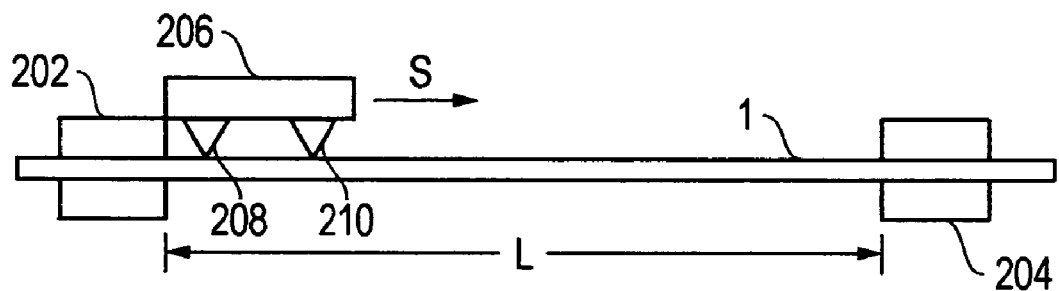
FIG. 2 illustrates an embodiment for carrying out I-V characterization for qualifying a superconducting conductor.

According to a particular development of the present invention, after fabrication of the superconductive article in the form of a long length coated conductor, the conductor is subjected to testing, for qualification prior to distribution. Turning to the drawings, FIG. 2 illustrates a basic schematic layout of a testing apparatus. The apparatus is provided in a suitable cryogenic containment (not shown). The apparatus includes first and second current leads 202, 204, respectively, which are enabled to electrically contact the coated tape-like conductor. Power may be supplied to the current leads 202, 204 through the cryogenic containment, through use of electrical contact brushes or Hg mediated current leads.

The current leads, 202, 204 apply a constant current $I_{cc}$ through the length of the conductor mounted between the current leads, denoted as "L". The constant current $I_{cc}$ is generally below and within the limit of current carrying capability under liquid nitrogen ($LN_2$) cooling conditions. This limit is referred to herein as $I_{cc}(max)$. Further, as shown, voltage head 206 includes first and second voltage contacts 208, 210, respectively. The voltage contacts, may be typically formed as finger-stocks or pogo-pins, adapted to gently bias and electrically contact the superconducting conductor. As shown, the contacts 208, 210 are spaced apart by a distance l. The voltage head 206 may be translated along length L and take various voltage readings associated with each segment along the entire length L, each segment having a length l as defined by the contact spacing. By taking voltage measurements along a desired length of the superconducting conductor, the integrity of the conductor can be measured, to ensure that the conductor meets design specifications. In actual use, measurements may be taken by translating the voltage head 206 continuously from the first end of the superconductor to the second end periodically recording voltage data while a constant current $I_{cc}$ is applied to the superconductor.

The constant current $I_{cc}$ is generally calculated based upon the geometrical configuration of the superconductor, including the thickness and the resistance of the stabilizer layer. In this regard, $I_{cc}(max)$ corresponds to how much current the conductor in cryogenic conditions can withstand before burnout. Burn-out is understood to occur due to a developed vapor barrier between the conductor and the surrounding low temperature liquid environment, generally accompanied by a spike in temperature because of poor heat transfer from the coated conductor to the surrounding cryogenic environment. As such, $I_{cc}(max)$ is typically a function of the geometry and material choice of the stabilizer layer(s) overlying the superconductive layer of the conductor.

By measuring voltage drop across a predetermined segment length l and taking multiple measurements across a length of a conductor, essentially that entire length L or even the entire length of the conductor can be tested and qualified to have the rated current carrying capability. Accordingly, based upon the measured data, the conductor can be rejected or accepted with a fairly high level of certainty. Acceptance criteria are described in more detail below.

Figure 3:
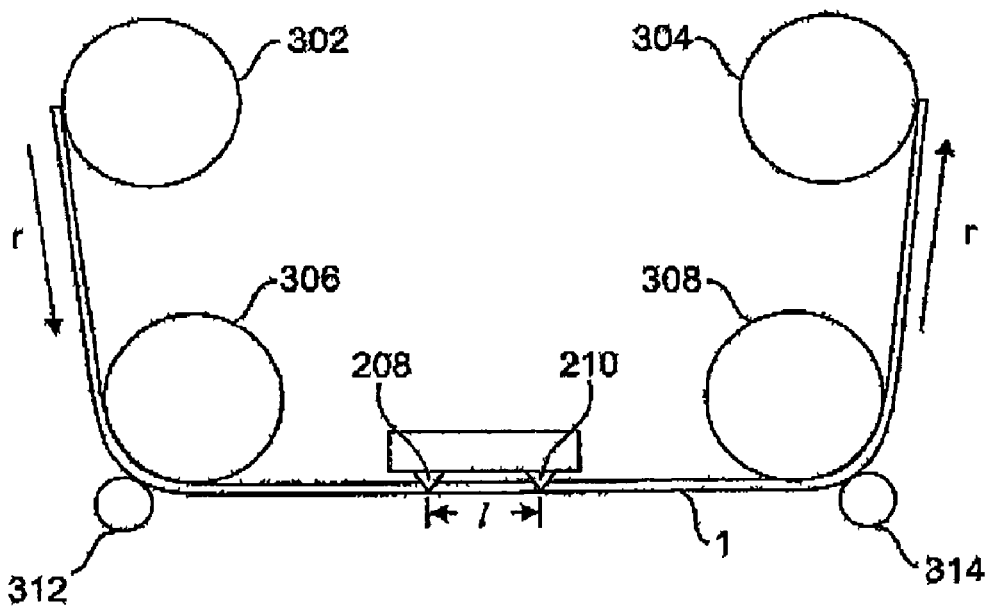
FIG. 3 illustrates an alternative embodiment for qualifying a superconducting conductor, particularly adapted for testing long-length conductors in a reel-to-reel process.

FIG. 3 illustrates a schematic of another embodiment for testing a superconducting conductor in a reel-to-reel process, particularly suited for testing long-length conductors, such as on the order of 10, 100, or 1,000 meters or greater. Testing begins with provision of a feed reel 302 containing a coiled conductor. The conductor is fed at a rate, r through the testing apparatus to a take-up reel 304 that actively takes-up the conductor. In this particular embodiment, the current $I_{cc}$ is applied through rollers 306, 308, defining therebetween a distance through which the conductor travels, along which the voltage head 206 resides. In a manner similar to the embodiment shown on FIG. 2, voltage head 206 includes voltage contacts 210. The distance through which the current $I_{cc}$ travels is generally significantly longer than the voltage tap distance l. The current connections from outside the $LN_2$ environment to the rollers 306, 308 can be made utilizing Hg mediated current leads or electrical brushes, as mentioned above. The rollers 306, 308 are typically formed of a good conductive material, such as copper or aluminum. Further, spring loaded wheels 312 and 314 may be utilized to bias the conductor against the current carrying rollers, to ensure good electrical contact between the conductor and the rollers.

In actual operation, testing may be carried out in a fairly rapid continuous process, in which the conductor is translated at a constant rate r, and the voltage measurements are taken at a sampling rate, such that the entirety of the conductor may be sampled, discussed in more detail hereinbelow. The sampling rate or rate at which voltage measurements are taken during translation of the conductor, may be chosen such that the segments are continuous, each succeeding segment beginning at the end point of the preceding segment, or such that a slight overlap is provided from segment to segment, to ensure that the entirety of the conductor is subjected to testing. Alternatively, in certain environments, it may be desirable to provide a discontinuous characterization test, wherein the sampling of voltage measurements may be taken intermittently only along selected portions of the conductor. According to one characteristic of the embodiment shown in FIG. 3, it should be noted that every segment subjected to voltage measurement has the same length l. That is, the voltage contacts 208, 210 are spaced apart by a fixed distance defining voltage tap distance l. While the apparatus illustrated in FIG. 3 allows continuous voltage measurements over the length of a conductor, it is noted that the apparatus need not be operated in a continuous fashion. That is, the apparatus may be operated in a start-stop mode, such as in the case of testing discrete and identifiable portions of the conductor, or in those cases where more sophisticated testing is to be carried out in order to measure voltage drop along a range of currents, rather than at a single current $I_{cc}$ (e.g., measuring of $I_c$). As should be clear from the above, the voltage sampling rate is a function of the conductor translation rate r and segment length l.

It is further noted that since current is only applied through a distance of the conductor defined between the rollers 306, 308, portions outside this zone, including those portions of the conductor that are wound onto feed reel 302 and take-up reel 304, are not subjected to any appreciable current, notably because the current contacts defined by rollers 306, 308 are outside of the feed and take-up reels 302, 304, respectively. Generally, it is desired that the quality of electrical contact between the conductor and the contacts is relatively high. For example, it is generally desired that the contact resistance is not greater than about 200 $\mu\Omega$, such as not greater than about 100 $\mu\Omega$, or even not less than about 20 $\mu\Omega$.

In a continuous operation mode, the new $I_c$ testing technique according to embodiments herein can be employed as an online quality control tool for post YBCO processes such as slitting and electroplating. For example, when a superconducting tape with known $I_c$ profile is subjected to electroplating process, a testing rig described in FIG. 3 without a feed reel can be installed right after the exit point of the electroplating process. Generally, a feed reel would serve as the feeding spool for electroplating, and is placed at non-cryogenic environment as the electroplater. The rollers would generally be immersed into liquid nitrogen. A current determined according to the known $I_c$ profile and process criterions are applied through them. The applied current is typically slightly lower than the minimum $I_c$ of that section before processed. If any voltage above the criterion is shown between the contacts, the section is known to have been degraded through the electroplating process, which is a sign that the process needs to be corrected.

Figure 4:
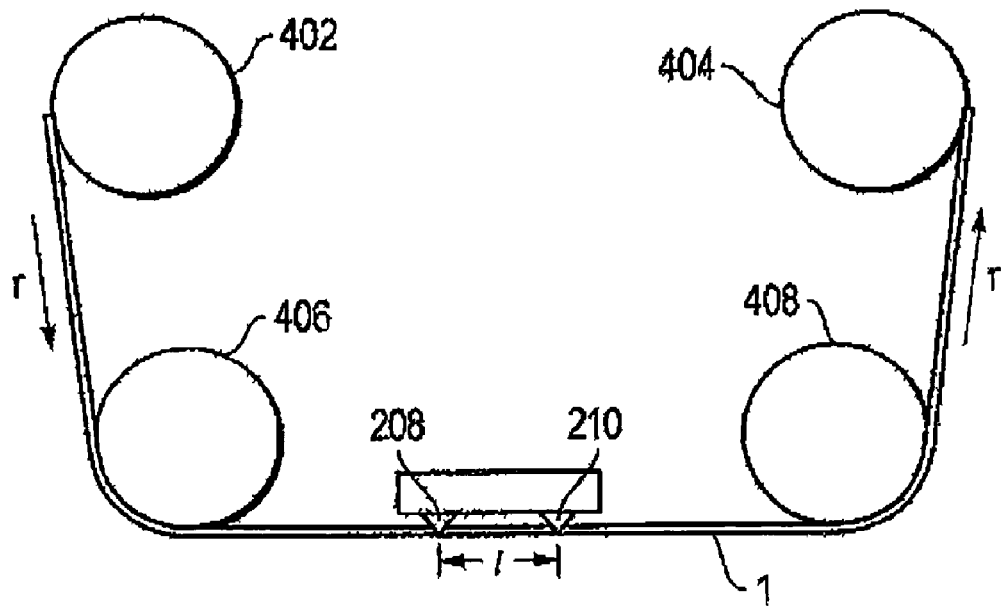
FIG. 4 illustrates a similar embodiment shown in FIG. 3, but with an alternative structure for applying current.

Turning to FIG. 4, an alternative embodiment is illustrated, notably maintaining the same basic architecture shown in FIG. 3, but with several differences. Here, rollers 306, 308 are replaced with pulleys 406, 408 that are not adapted to apply an electrical current. The current is provided through contact with the conductor at feed reel 402 and take-up reel 404. Electrical contact with the conductor may be made at respective opposite ends, through techniques such as soldering or by press-contact. Again, Hg mediated current leads or electrical brushes may be utilized to make current contact outside the liquid nitrogen environment to reels 302, 304. Accordingly, in the particular embodiment shown in FIG. 4, spring-loaded wheels 312, 314 shown in FIG. 3 are generally not necessary for application of power.

Because electrical contact to the conductor, in coiled or bulk form, is made through the reels 302, 304, an interleaf material providing electrical insulation may be provided between turns of the conductor. An interleaf may avoid burn out of the tape due to reasons such as arcing, generating heat between coils of the conductor.

Figure 5:
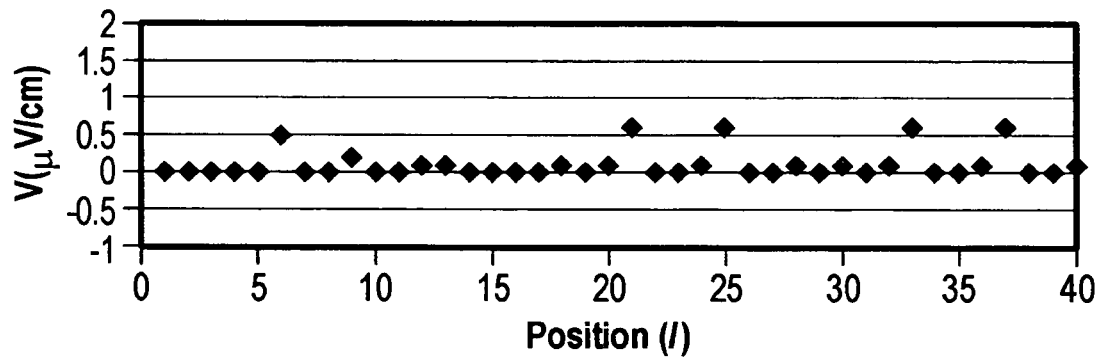
FIGS. 5-7 illustrate data plots that may be generated by carrying out testing according to embodiments described herein.
Figure 6:
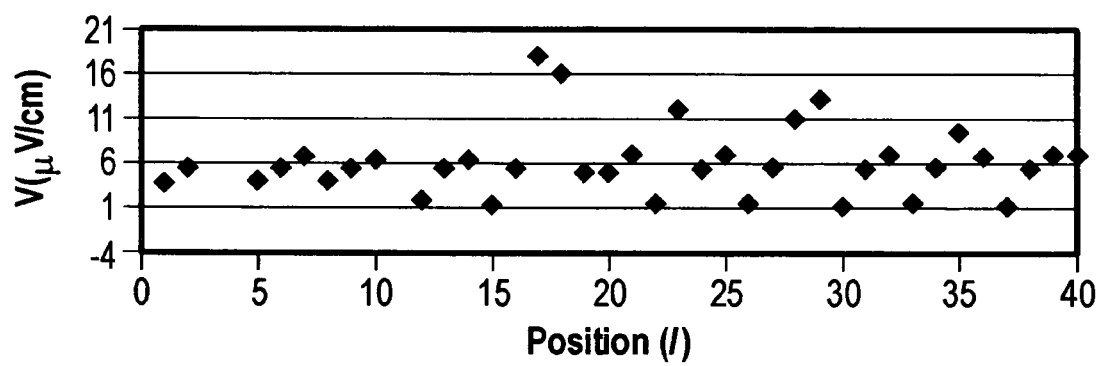
Figure 7:
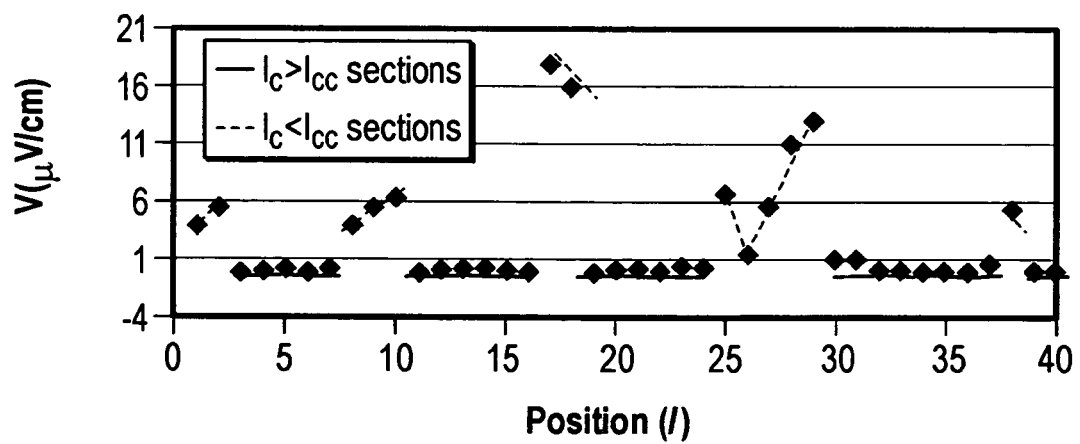

Turning to FIGS. 5-7, illustrative data are provided for various sample lengths. Based upon a standard maximum accepted voltage drop, which, in this case, is 1 µV/cm, FIG. 5 represents a conductor segment in which $I_{cc}$<minimum $I_c$(critical current) for every segment along the measured length, and V<1 µV/cm through the entirety of the conductor. In contrast, FIG. 6 illustrates an embodiment where every segment demonstrated a voltage drop higher than the accepted 1 µV/cm. Here, $I_{cc}$>maximum $I_c$, for every segment length, and V>1 µV/cm. FIG. 7 illustrates a conductor having sections that fall within spec and outside of spec. Namely, FIG. 7 includes segments along which $I_c$ is greater than $I_{cc}$, connected together by a solid line shown in FIG. 7, and other segments where $I_c$ is less than $I_{cc}$, shown by dashed lines, those portions being out of spec, demonstrating a voltage drop greater than 1 µV/cm. It is noted that the standard maximum voltage can be different than the current 1 µV/cm value. However, it is expected that the standard as accepted by the superconductor community will be generally not greater than 1 µV/cm.

Figure 8:
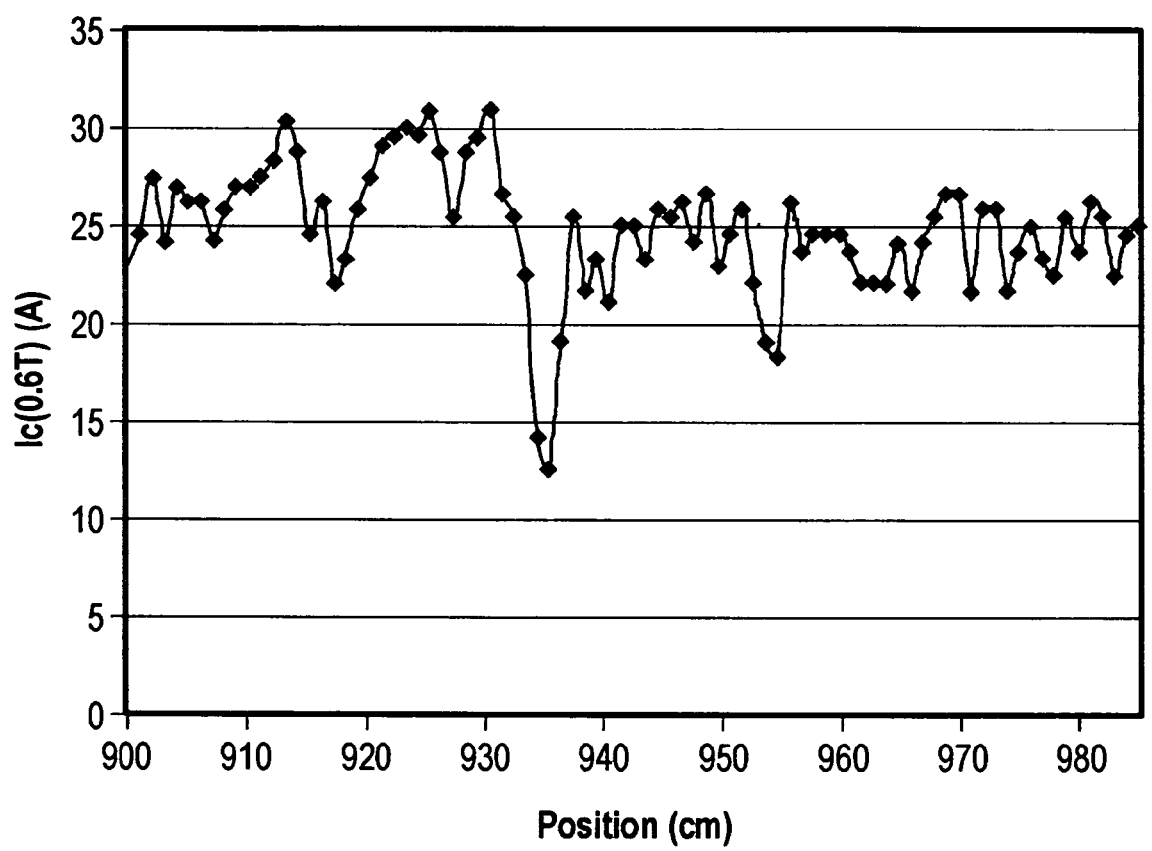
FIG. 8 illustrates a data plot of $I_c$ vs. position of a coated superconductor according to conventional characterization techniques.

Turning to FIG. 8, an $I_c$ vs. position profile of a coated superconductor was obtained by a traditional method using an apparatus similar to the one shown in FIG. 2. Testing was carried out in a small field (~0.6 T) applied a coated conductor tape. Eighty six I-V curves were tested to generate the plot shown in FIG. 8, and a total testing time of ~170 min was needed. A weak spot with $I_c$(0.6 T) of 12.5 A was located.

Figure 9:
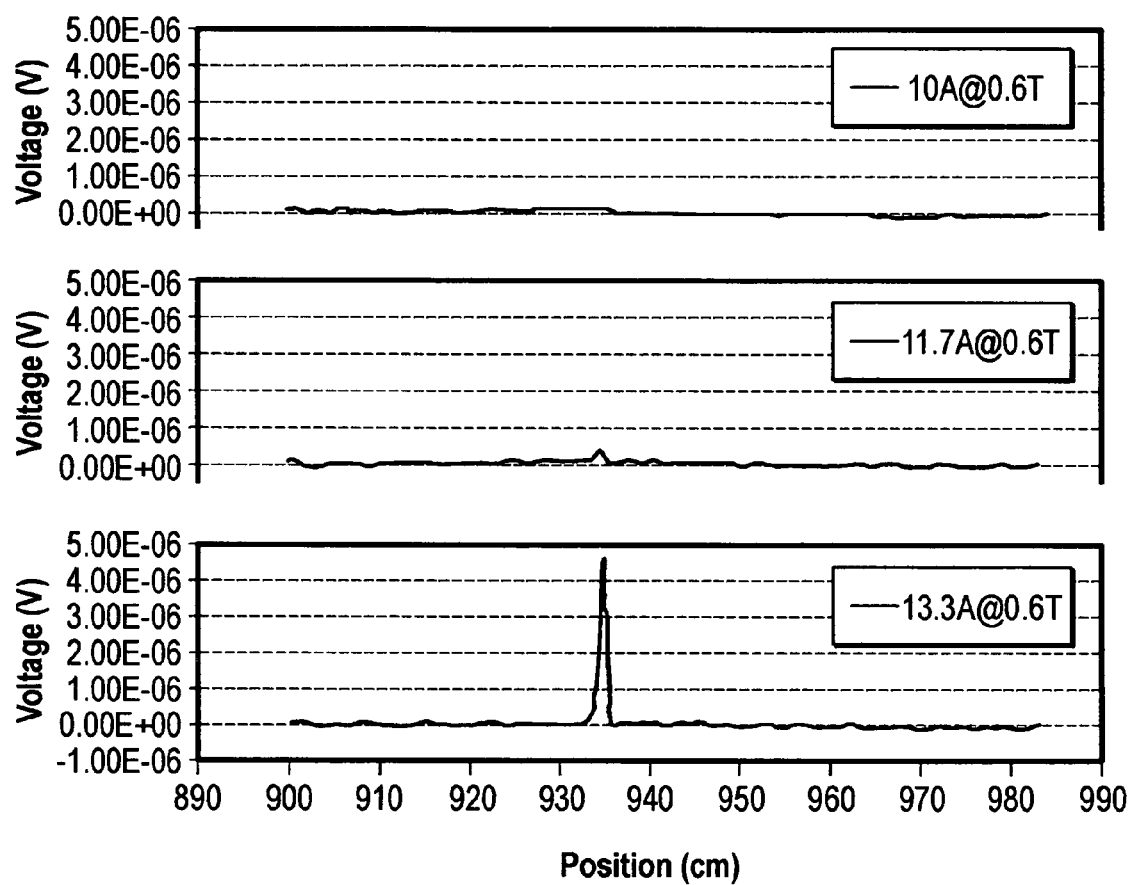
FIG. 9 illustrates voltage as a function of position along a length of the same coated superconductor characterized in FIG. 8.

In FIG. 9, using the apparatus illustrated in FIG. 2, voltage was recorded at different positions while a constant current $I_{cc}$ was applied to the tape. Three repeated measurements were taken at different $I_{cc}$ levels: 10 A, 11.7 A and 13.3 A for the same coated superconductor characterized in FIG. 8. A weak section with $I_c$ (0.6 T) of between 11.7 to 13.3 A at 935 cm was pinpointed. The total testing time can be shortened by a factor of more than 5.

Further, while the foregoing makes reference to a single constant current $I_{cc}$ the measuring of voltage drop for various constant current values may be carried out. For example, increasing $I_{cc}$ values could be chosen, such that the rated current carrying capacity of the conductor can be more precisely determined for any given length. Certain applications may only need a relatively modest current carrying capability, and conductors that fail to qualify at higher $I_{cc}$ values may be perfectly suitable for such applications. It would not be uncommon to carry out qualification based on three, four, or even a greater number of constant current values, each being associated with a separate voltage sampling or measuring step. In another embodiment, decreasing constant $I_{cc}$ values may be used.

Again referring to FIG. 2, assuming the voltage head 206 is translating at a speed s, voltage data may be taken at every time increment defined l/s, and the measurement can finish in a time L/s. Since the response time for voltage measurement is quick, the constant speed s can be set at high values, and the entire sample period L/s can be significantly short. For example, if L=1 meter and s=1 meter/minute, the total time need to finish an $I_{cc}$ scanning is one minute regardless of the particular value for l. If ten important $I_{cc}$ values are chosen to do scanning, the entire process would only take ten minutes. If l is equal to 5 mm, one can simply take a voltage reading every 0.3 seconds. In contrast, according to conventional technology, an I-V curve measured for every 5 mm will take greater than 200 minutes based upon these values.

In the embodiment shown in FIGS. 3 and 4, one can take voltage data at a sampling rate l/r, when $I_{cc}$ is passed through the conductor through rollers 306, 308. If the total length of the entire conductor is L, the scanning will take L/r regardless of the length of l. For example, if L equals 1000 meters, and r equals 5 meters/minute, the total time will be 200 minutes. For l equal to 5 centimeters, one can take a voltage reading every 0.6 seconds. That is, the length l partly determines the rate at which voltage is sampled, but not the entire duration of the test. The voltage sampling rate can also be different from l/r, say (l/r)/M, where M could be any number less than or not less than 1. If M is less than 1, the test would be taken for a segment of length "l" at every "l/M" (l/M>1) and the obtained information would be not cover the entire length of the superconductor, although full-length testing is recommended. For M>1, an integer number such as 2 or 3 is recommended for convenience of data analysis.

Further, when $I_{cc}$ exceeds $I_{cc}$(max) the conductor may be burned out during measurement. Here, it is noted that $I_{cc}$(max) is determined by the minimum sectional $I_{cc}$ and stabilizer performance. Accordingly, the embodiments described herein are particularly adapted for use in connection with coated superconducting conductors having a fully developed stabilizer or stabilizer layer. For those conductors having minimal stabilizer, a small magnetic field such at 0.5-0.6 T can be applied perpendicular to each section during measurement, so that the $I_c$, of all segments will be suppressed by a factor of 4-8 and $I_{cc}$ that is needed to fully test an entire conductor will also be reduced, and the techniques described herein can be used for defect detection. The external magnetic field may have different values and be applied along different directions based on the superconductor qualification needs.

While particular aspects of the present invention have been described herein with particularity, it is well understood that those of ordinary skill in the art may make modifications hereto yet still be within the scope of the present claims.

What is claimed is:

1. A method for testing a superconducting conductor, comprising:
   providing a superconducting conductor; and
   measuring a voltage over each segment of a plurality of segments of the superconducting conductor in a cryogenic condition while maintaining a constant current $I_{cc}$ through the superconducting conductor from one segment to a next segment of the plurality of segments,
   wherein measuring is carried out by translating the conductor in a reel-to-reel apparatus including a feed reel and a take-up reel, wherein the current is passed through current contacts that are in electrical contact with the conductor at positions inside the feed and take-up reels.

2. The method of claim 1, wherein the step of measuring is carded out multiple times, each with a respective constant current $I_{cc}$.

3. The method of claim 2, wherein the constant current $I_{cc}$ is increased with sequential measurements of voltage.

4. The method of claim 1, wherein each segment of the plurality of segments has a generally the same length l.

5. The method of claim 4, wherein the conductor is translated continuously during measuring, the constant current $I_{cc}$ being applied during measuring while periodically taking voltage measurements.

6. The method of claim 5, wherein voltage measurements are taken according to a voltage sampling rate, voltage sampling rate being a function of conductor translation rate r and segment length l.

7. The method of claim 1, wherein substantially an entire length of the conductor is subjected to measuring, such that substantially the entire conductor is tested.

8. The method of claim 1, wherein the voltage is measured between first and second voltage contacts spaced apart by a length l thereby defining a segment length, wherein the conductor translates past the voltage contacts during measuring.

9. The method of claim 1, wherein the current is passed through current contacts that are in electrical contact with opposite ends of the conductor.

10. The method of claim 1, wherein the current contacts have a contact resistance with the conductor that is not greater than about 200 $\mu\Omega$.

11. The method of claim 1, wherein the current contacts have a contact resistance with the conductor that is not greater than about 100 $\mu\Omega$.

12. The method of claim 1, wherein the current contacts have a contact resistance with the conductor that is not greater than about 20 $\mu\Omega$.

13. The method of claim 1, wherein the constant current $I_{cc}$ is a target current carrying capability of the conductor.

14. The method of claim 13, further comprising a step of rejecting or accepting the conductor based on measured voltage.

15. The method of claim 14, wherein the conductor is accepted or rejected based on a measured voltage, which is less than or greater than a standard maximum voltage.

16. The method of claim 15, wherein the standard maximum voltage is not greater than of 1 $\mu V$ per cm of conductor.

17. The method of claim 15, wherein the standard maximum voltage is about 1 $\mu V$ per cm of conductor.

18. The method of claim 15, wherein the conductor is accepted, substantially every segment having a voltage less than the standard maximum voltage.

19. The method of claim 1, wherein the conductor includes a superconductor layer and a stabilizer layer overlying the superconductor layer, the stabilizer layer comprising a metal.

20. The method of claim 1, wherein the conductor includes a superconductor layer and a buffer layer, over which the superconductor layer is provided.

21. The method of claim 20, wherein the buffer layer comprises a biaxially textured layer.

22. The method of claim 1, wherein the conductor includes a superconductor layer comprised of a high temperature superconductor.

23. The method of claim 22, wherein the high temperature superconductor comprises $REBa_2Cu_3O_{7-x}$, wherein RE is a rare earth element.

24. The method of claim 23, wherein the superconductor material comprises $YBa_2Cu_3O_7$.

25. The method of claim 1, wherein the conductor has an dimension ratio of not less than $10^2$.

26. The method of claim 1, wherein the conductor has a dimension ratio of not less than $10^3$.

27. The method of claim 1, wherein the measuring step is repeated with a different constant current $I_{cc}$ value.

28. The method of claim 1, wherein the measuring step is repeated multiple times with increasing constant current $I_{cc}$ values.

29. The method of claim 1, wherein the measuring step is repeated multiple times with decreasing constant current $I_{cc}$ values.

* * * * *